United States Patent [19]

Coleman, Jr.

[11] Patent Number: 4,831,427

[45] Date of Patent: May 16, 1989

[54] FERROMAGNETIC GATE MEMORY

[75] Inventor: Donald J. Coleman, Jr., Plano, Tex.

[73] Assignee: Texas Instruments Incorporated, Dallas, Tex.

[21] Appl. No.: 76,810

[22] Filed: Jul. 23, 1987

[51] Int. Cl.$^4$ .................. H01L 27/22; H01L 29/82; H01L 29/96; H01L 43/00
[52] U.S. Cl. ................................. 357/27; 357/23.5; 365/171
[58] Field of Search ................ 357/27, 23.5; 365/171, 365/182

[56] References Cited

U.S. PATENT DOCUMENTS 4,607,271  8/1986  Popovic et al. .................. 357/27

FOREIGN PATENT DOCUMENTS 57-68092  4/1982  Japan .

OTHER PUBLICATIONS

Sax, N. et al., *Hawley's Condensed Chemical Dictionary*, 11th Ed., Van Nostrand, 1987, p. 889.

Primary Examiner—Andrew J. James
Assistant Examiner—Sara W. Crane
Attorney, Agent, or Firm—Larry C. Schroeder; Leo N. Heiting; Melvin Sharp

[57] ABSTRACT

A memory cell (10) comprises a ferromagnetic gate (12) disposed above a source (18) and a drain (20) in a substrate (16). A magnetic field is created in the ferromagnetic gate (12) by producing a large current between the source (18) and drain (20). The orientation of the magnetic field will depend upon the direction of the current flow. To read information from the memory cell (10), a small current is passed from source (18) to drain (20); if the electrons (25) are deflected upwards towards the surface (24) of the substrate (16), a lesser current will result than if the electrons (25) are deflected downward towards the bottom of the channel (22). Hence, the magnetic orientation, and therefore the information stored within the memory cell (10), can be determined by the amount of current detected.

25 Claims, 3 Drawing Sheets

FERROMAGNETIC GATE MEMORY

TECHNICAL FIELD OF THE INVENTION

This invention pertains in general to nonvolatile memories, and more particularly to nonvolatile memories which store information in a ferromagnetic gate region.

BACKGROUND OF THE INVENTION

Nonvolatile memories retain their stored information after their power supply has been turned off, and have many applications in digital information systems, control apparatus, and other electronic systems. Although several forms of nonvolatile memories exist, each has serious shortcomings.

Over the last ten years, much work has been performed developing magnetic bubble memories. However, bubble memories remain complex, and require a large current drive for their operation. Additionally, the cost of bubble memory greatly exceeds that of other memory devices.

EPROMs and EEPROMs are capable of retaining information over the extended periods of time without losing data, but the charge, and therefore the data, within an EPROM or an EEPROM will eventually be lost. Furthermore, changing the information stored in an EPROM or an EEPROM cannot be performed rapidly. Static RAMs and dynamic RAMs, while not nonvolatile, can be maintained by a battery during periods when system power is turned off. However, batteries have a relatively short useful life, and thereby present the danger of losing valued information as the batteries wear out.

While important strides have been made in improving the storage capacity of random access memories, it is still desirable to increase the storage capacities further, especially in nonvolatile devices.

Thus, a need has arisen in the industry for a fast, nonvolatile memory having a high storage capacity.

SUMMARY OF THE INVENTION

The present invention disclosed and claimed herein describes a method and apparatus for storing information which substantially eliminates problems associated with prior memory devices.

In one aspect of the invention, information is magnetically stored in a memory cell by passing a current beneath a ferromagnetic region, thereby magnetizing the ferromagnetic region. Current in a first direction causes a predetermined magnetic field in the ferromagnetic region, and current in the opposite direction will create an opposite magnetic field. To read information from the ferromagnetic memory cell, a small current is passed beneath the magnetized ferromagnetic region. Depending on the orientation of the magnetic field of the ferromagnetic region, the electrons will be deflected towards or away from the surface of the substrate. Electrons deflected towards the surface of the substrate will be scattered by surface impurities, thus reducing the mobility of the electrons, and thereby decreasing the magnitude of the resultant current. A current subjected to a magnetic field pushing the electrons away from the surface will not exhibit a mobility loss due to surface scattering effects. Hence, the magnetic field orientation representing the stored information can be detected by measuring the magnitude of the current and comparing it against a reference value to determined whether surface scattering was in affect.

It is a techanical advantage of this aspect of the invention that nonvolatile memories capable of storing information over a long period of time can be produced.

It is a further advantage of the present invention that the resulting memory will have relatively fast access times, limited only by how quickly the domain can be magnetically changed in the ferromagnetic region. It is another advantage of the present invention that a simple structure for the memory cells may be obtained which allows a high density of memory cells to be formed on a single chip.

BRIEF DESCRIPTION OF THE DRAWINGS

For a more complete understanding of the present invention and the advantages thereof, reference is now made to the following description taken in conjunction with the accompanying drawings in which.

DETAILED DESCRIPTION OF THE INVENTION

For a more complete understanding of the present invention, reference is now made to FIGS. 1-5 of the drawings, like numerals being used for like and corresponding parts of the various drawings.

Figure 1:
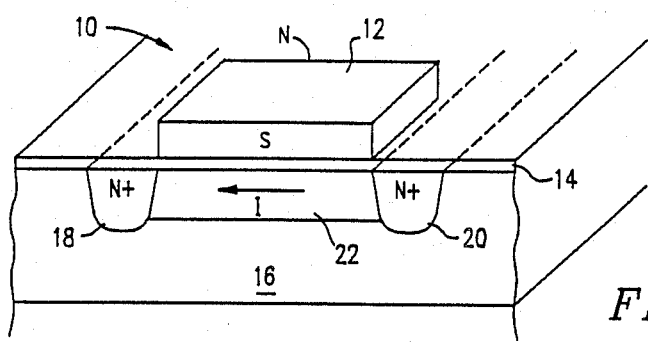
FIG. 1 illustrates a perspective view of a memory cell storing information in a ferromagnetic gate.

FIG. 1 illustrates a perspective view of a memory cell having a ferromagnetic gate. The ferromagnetic gate memory cell (hereinafter "memory cell") 10 comprises a gate 12 formed from an electrically conducting ferromagnetic material. A thin insulating layer 14 separates the gate 12 from the substrate 16. Two N+ regions serve as the source 18 and drain 20 of the memory cell; for illustration purposes, the regions will be denoted as source 18 and drain 20, although the actual configuration of source and drain will depend upon the voltages applied to each region. An inversion layer or channel 22 is created in the substrate 16 when a voltage is applied to the gate 12. A current between the source 18 and drain 20 is illustrated by the reference character I.

The gate 12 is formed from a ferromagnetic material which is operable to conduct an electrical current. An example of an electrical conducting ferromagnetic material would be "permalloy", although many other similar materials are known to exist. It is important that the gate 12 be electrically conducting so that the channel 22 may be formed.

The remaining aspects of the memory cell 10 are similar to those found in a MOS transistor. For example, source and drain regions 18 and 20 may be formed by diffusing N+ regions into a P type substrate.

Information is written into or stored in the memory cell 10 by creating a local magnetic field in the gate 12. The magnetic field is created by passing a high current between the N+ source/drain regions 18 and 20. As illustrated, a high electron flux passed from source 18 to drain 20 (by convention, current I is shown from drain 20 to source 18) will create a magnetic field in gate 12 having a particular orientation. This orientation may represent a specified logic state, such as a logic "one." A high electron flux passed in the opposite direction, from "drain" 20 to "source" 18, would result in a magnetic field in gate 12 having the opposite orientation. This orientation would thus represent the opposite logic state, such as a logic "zero." Thus, digital information is stored in the memory cell by the orientation of the magnetic field produced in the gate 12. This produces the technical advantage that the information stored in the memory cell 10 will be nonvolatile, since the magnetic field of the gate 12 is not dependent upon the power supply.

Figure 2A:
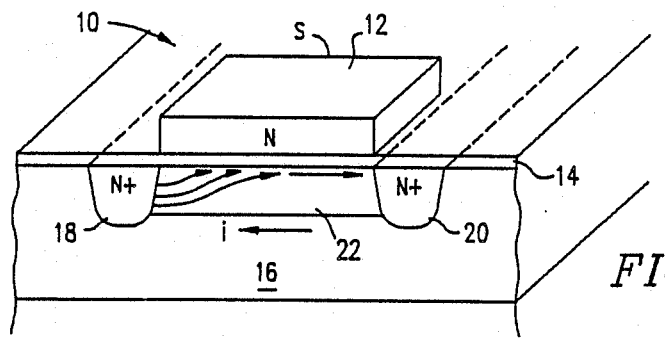
FIGS. 2a–b illustrates a perspective view of the memory cell of FIG. 1 during a read operation.
Figure 2B:
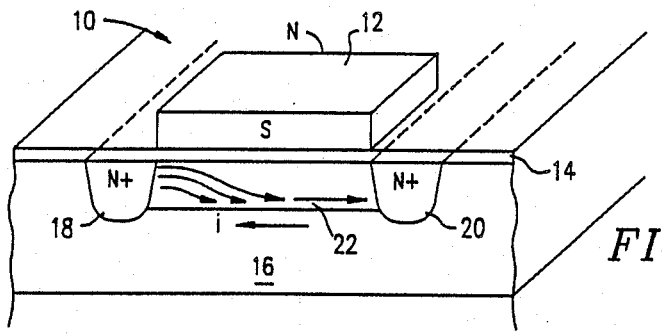

FIGS. 2a-b illustrate the memory cell of FIG. 1 during a "read" operation. In FIG. 2a, a magnetic orientation on the gate 12 is such that the front of the ferromagnetic gate 12 has a north pole, and the back of the gate 12 has a south pole, as illustrated by reference characters N and S. This north/south orientation would be created by a large electron flux passing from drain 20 to source 18.

To read information from the memory cell 10, a small electron flux creating a current "i" is passed from source 18 to drain 20 as a result of a voltage between the source 18 and a drain 20. With the magnetic orientation illustrated in FIG. 2a, electrons passing from source 18 to drain 20 will be pulled upwards towards the surface of the substrate 16 just below the insulating layer 14. Hence, the electron flux from source 18 to drain 20 will flow substantially along the substrate surface.

As will be discussed in more detail in connection with FIG. 3, the mobility of the electrons travelling at the surface of the substrate 16 will be impeded, due to surface scattering mechanisms. Consequently, the flow of electrons from source 18 to drain 20 will be impeded and reduced by the magnetic field illusrated in FIG. 2a due to surface scattering effects.

FIG. 2b illustrates a perspective view of the memory cell 10 during a read operation in which the ferromagnetic gate has a magnetic field orientation opposite to that of FIG. 2a. This magnetic field orientation could be created by passing a large electron flux from source 18 to drain 20 as illustrated in FIG. 1.

Once again, a small predetermined voltage is generated between source 18 to drain 20 in order to perform a read operation. In this instance, the magnetic field present on gate 12 pushes electrons in the resultant current towards the bottom of the channel 22. The bottom of the channel 22, being in the bulk of the substrate 16, does not impede the flow of electrons to the degree exhibited by the surface of the substrate 16. Hence, in response to an applied voltage, a larger current will pass between source 18 and drain 20 with the gate 12 having the magnetic orientations specified in FIG. 2b than with the gate 12 having the magnetic orientations specified in FIG. 2a. This difference in current level may thus be detected to read either a logic "one" or "zero" stored in the cell 10. Suitable current level detection circuitry may be coupled to the cell to detect the electron mobility.

Figure 3:
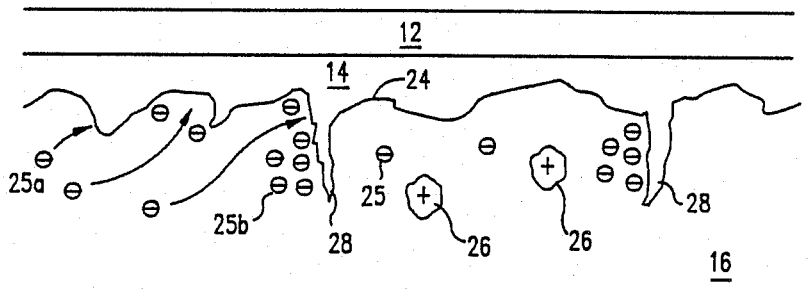
FIG. 3 illustrates the surface scattering effects inherent in a magnetic orientation forcing electrons towards the substrate surface.

FIG. 3 illustrates a mechanism by which the mobility of the electrons in FIG. 2a is reduced. FIG. 3 illustrates a cross section of the gate 12, insulating layer 14, and substrate 16. The surface 24 of the substrate 16 will be irregular, impeding movement of the electrons 25 at the surface 24 as illustrated by impeded electrons 25a. Also, impurities 26, which may be added to the area just below the surface 24, will further deflect the electrons 25 away from a straight path between source 18 and drain 20. By roughening the surface 24, by means such as laser treatment, crevices 28 may be formed which will further immobilize electrons 25b near the surface 24. While some irregularities may exist at the bottom of the channel 22, their number will not be nearly as great in magnitude, and thus their effect on the magnitude of the current will be much less.

Studies have shown that a ferromagnetic field at the surface may act vary the magnitude of the current by as much as 1%. By further reducing the mobility of the electrons by controlled fracturing of the surface and adding impurities, the differential between a current travelling at the surface 24 of the substrate 16 and a current travelling at the bottom of the channel 22 should be even greater than 1%. Other techniques are available for reducing mobility of electrons at the surface, such as providing an amorphous layer at the surface 24. Alternatively, the substrate could be made of a substance having much higher mobility, such as InSb, which will proportionally affect the difference in mobility and facilitate reading of the information.

Figure 4A:
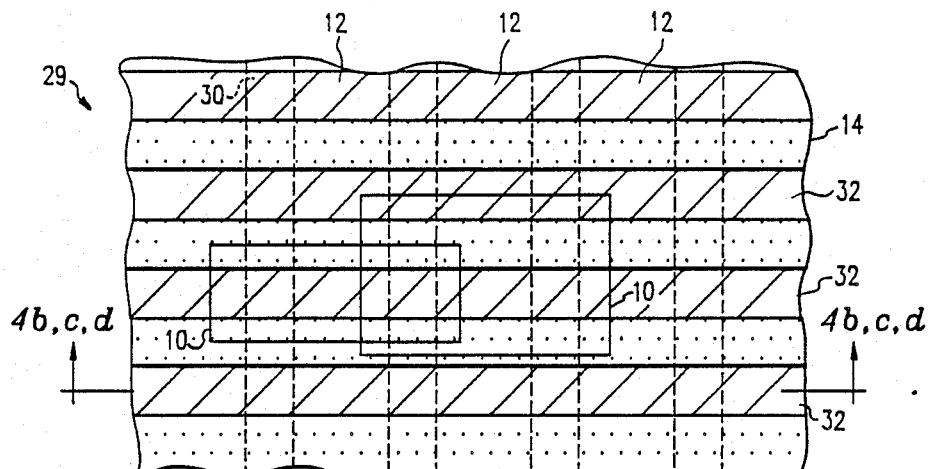
FIGS. 4a–f illustrate embodiments for producing an array of ferromagnetic gate memory cells.
Figure 4B:
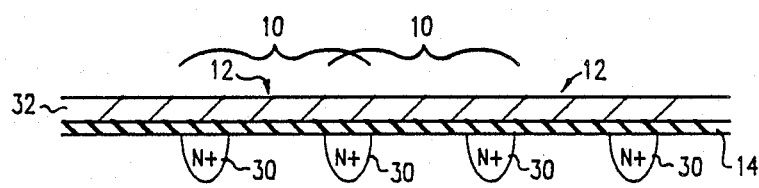

FIGS. 4a-d illustrate various embodiments of an array 29 of memory cells 10. FIG. 4a illustrates a top view of an array of memory cells 10, comprising strips of ferromagnetic gate material 32 in parallel on top of the insulating layer 14. Memory cells 10 are shown in an embodiment where N+ channels 30 are shared between cells 10 to increase cell density. In FIGS. 4a-b, N+ channels 30, which form the source and drain regions 18 and 20, lie beneath the insulating layer 14. Strips of the ferromagnetic gate material 32 are positioned normal to the N+ channels 30. Regions of the insulating layer 14 between the ferromagnetic strips 32 form a channel stop. Portions of the strips of ferromagnetic gate material 32 lying between the N+ channels 30 comprise the gates 12 of the individual memory cells 10. The N+ channels 30 are shared between memory cells 10, i.e., the source of one memory cell 10 is the drain of the adjacent memory cell, in order to increase the density of the memory cell 10.

To address a memory cell 10, N+ channels 30 on one side of the memory cell 10 are held to a high voltage, while N+ channels 30 to the other side of the memory cell 10 would be held to a low voltage, normally ground. A voltage applied to the strip of ferromagnetic gate material 32 will create channels beneath the strips, through which current can flow. Thus, a potential would exist between two of the N+ channels 30 resulting in a current being passed between them. A write operation would vary the direction of the current flow depending on whether a "1" or a "0" was being written to the memory cell. Normally, the current will always be passed in the same direction during a read operation. The magnitude of the voltage applied to the N+ channels 30 would also depend upon whether a read or a write operation was being performed, since a write operation passes a high current and a read operation passes a low current.

Figure 4C:
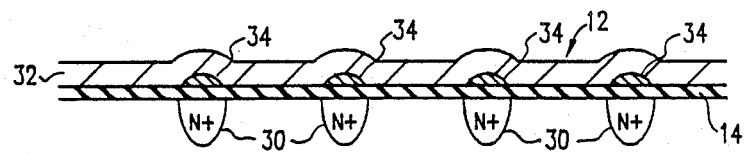

FIG. 4c illustrates an alternative embodiment for the memory array 29. In this embodiment, a thick oxide layer 34 is formed above the N+ channels 30 on top of the insulating layer 14. This embodiment substantially reduces the capacitance of the ferromagnetic gate strips 32.

Figure 4D:
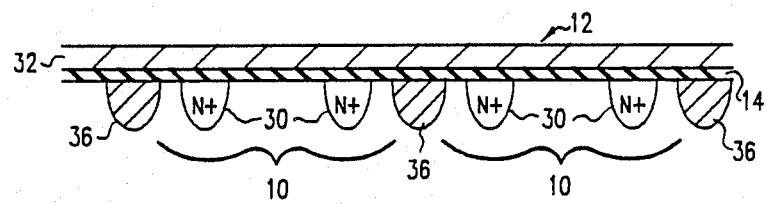

Another embodiment of the present invention is illustrated in FIG. 4d, wherein a channel stop region 36 is placed between every other N+ channel 30. In this embodiment, N+ channels 30 are not shared between memory cells. Thus, to address a particularly memory cell 10, a high voltage is applied to one N+ channel of the memory cell and a low voltage is applied to the other N+ channel of the memory cell.

Figure 4E:
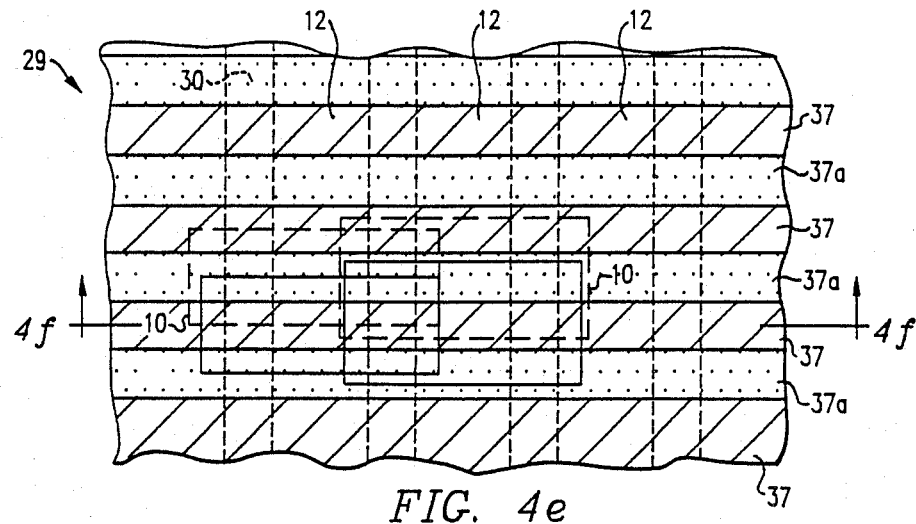
Figure 4F:
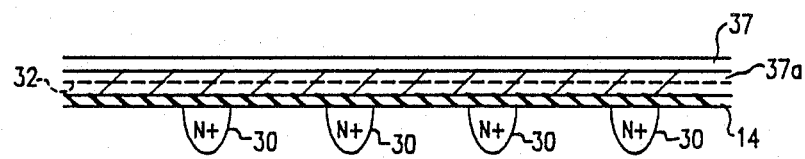

Another embodiment of the present invention is illustrated in FIGS. 4e-f, wherein an electrically insulating layer 37 is formed to encase the first layer of ferromagnetic material 32 and a second layer of ferromagnetic material 37a is formed into parallel strips positioned to cover the space between the strips of the first layer of ferromagnetic material 32. In this embodiment, only the N+ channel regions 30 are inactive memory locations, thus providing the highest memory density possible.

Figure 5:
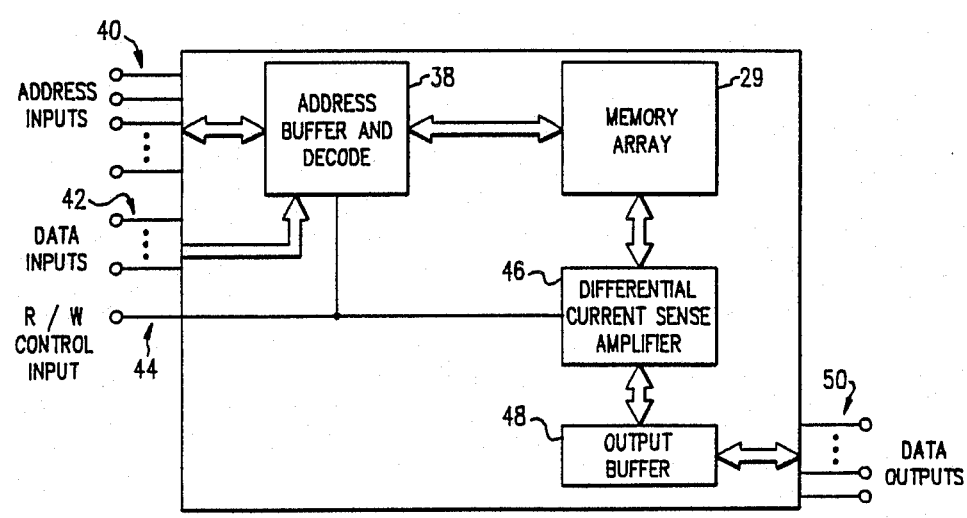
FIG. 5 illustrates a block diagram of a integrated circuit using the present invention.

FIG. 5 illustrates a block diagram of a memory architecture particularly suitable for use with the present memory cells. The memory array 29 is addressed by an address buffer and decode section 38 which receives address inputs 40 from outside circuitry. The address buffer and decode section 38 drives the N+ channels 30 and ferromagnetic gate material 32 to address particular cells as described in connection with FIGS. 4a-d. Data inputs 42 are received by the address buffer and decode section 38 to determine the direction of the current for each of the memory cells addressed. A read/write control input 44 is connected to the address buffer and decode section 38 indicating whether the operation is to be a read operation or a write operation.

During a read operation, the output of the memory cells address is received by a differential current sense amplifier section 46 which compares the current output from the memory cell to a reference current to determine whether the stored information is a "1" or a "0". The data from the differential current sense amplifier 46 is sent to an output buffer 48 which is connected to data outputs 50 for interaction with outside circuitry.

Since the geometries of the memory cells can be made as small as photolithography techniques will allow, the memory array 29 may have a very high density. Using a two micron spacing between N+ channels 30 and two micron strip widths for both ferromagnetic gate regions 32 and 37 illustrated in FIG. 4e, approximately 1.6 million memory cells may be provided on 20,000 sq. mils. Allowing another 20,000 sq. mils for the remaining circuitry, a 1.6 megabit memory chip may be provided for on less than a 40,000 sq. mil integrated circuit.

Since the information is stored by the magnetic field, the data stored in memory of the present invention should not deteriorate for many years, so long as another magnetic field does not influence the ferromagnetic gates. This provides the technical advantage of a longer storage period than existing technologies.

This invention also provides an advantage that relatively low currents can be used to read and write to the memory cells, as opposed to magnetic bubble memories in which a relatively high current is necessary.

Although a preferred embodiment of the present invention has been described in detail, it should be understood that various changes, substitutions and alterations can be made herein without departing from the spirit and scope of the invention as defined by the appended claims.

What is claimed is:

1. A nonvolatile memory cell comprising:
   a substrate of first conductivity type;
   a gate formed from a ferromagnetic, conductive material, said gate overlying a channel region in said substrate;
   first and second doped regions of a second conductivity type separated by said channel region, said channel region being conductive in either of a first or a second direction in response to a voltage differential between said first and second doped regions when a voltage is applied to said gate; and
   said gate assuming a first magnetic orientation in response to high current through said channel region in said first direction and a second magnetic orientation in response to a high current through said channel region in said second direction, in order to write selected data into the cell.

2. The memory cell of claim 1 and further comprising circuitry to determine the magnetic orientation of said gate region in order to read data from the cell.

3. The memory cell of claim 1 wherein low current through said channel region is deflected in a third direction in response to said first magnetic orientation and in a fourth direction in response to said second magnetic orientation.

4. The memory cell of claim 2 wherein said circuitry comprises means for determining the direction of deflection of a small current passed through said channel region.

5. The memory cell of claim 4 wherein said means for determining the direction of deflection comprises circuitry to measure the magnitude of a current generated in response to a voltage differential between said doped regions.

6. The memory cell of claim 4 wherein said circuitry for determining the direction of deflection comprises a differential current sense amplifier.

7. The memory cell of claim 1 and further comprising:
   means for receiving a data input having either a logical high or a logical low value; and
   circuitry to pass a high current from said first doped region to said second doped region in response to a logical high input and pass a high current from said second doped region to said first doped region in response to a logical low input.

8. The memory cell of claim 1 wherein the surface of said substrate below said gate is manufactured such that the mobility of electrons at said surface is impeded.

9. The memory cell of claim 1 wherein said gate comprises a layer of nickel-iron alloy.

10. The memory cell of claim 1 wherein said first conductivity type comprises a P type material and said second conductivity type comprises an N type material.

11. A nonvolatile memory array comprising:
    a substrate of a first conductivity type;
    a plurality of ferromagnetic regions overlying respective channel regions in said substrate region, said ferromagnetic regions being aligned substantially parallel to each other;
    a plurality of doped regions of a second conductivity type aligned substantially parallel to one and substantially normal to said ferromagnetic regions; and
    said ferromagnetic regions assuming a first magnetic orientation in response to a high current passed through a portion of said channels between adjacent doped regions in a first direction and assuming a second magnetic orientation in response to a high current through said portion of said channel in a second direction, said magnetic orientation being local to a portion of said ferromagnetic region above said portion of said channel region through which said high current is passed, such that selected logic data is stored in said ferromagnetic region in response to the passing of high current through said channel regions.

12. The memory array of claim 11 wherein a high current is passed between adjacent doped regions by applying a high voltage to ones of said doped regions and a low voltage to other ones of said doped regions.

13. The memory array of claim 11 and further comprising circuitry to generate a voltage differential between a first selected doped region and a second selected doped region in order to generate a current therebetween, said first and second selected doped regions being adjacent each other on opposite sides of one of said ferromagnetic regions.

14. The memory array of claim 11 and further comprising circuitry for determining the magnetic orientation of the predetermined portion of said ferromagnetic regoin.

15. The memory array of claim 14 wherein said circuitry for determining the magnetic orientation cmprises comparator circuitry for measuring a current generated in response to a predetermined voltage applied between doped regions defining said portion of said ferromagnetic region and comparing said measured current to a reference current.

16. The memory array of claim 15 wherein said compare circuitry comprises a differential current sense amplifier.

17. A method for storing a data bit having a logical value on a semiconductor device having a substrate of a first conductivity type,
a gate region of ferromagnetic material which overlies a channel region in said substrate, and
first and second doped regions of a second conductivity type in said substrate, separated by said channel region, comprising the steps of:
generating a high current through said channel region in a predetermined direction corresponding to the logical value of the data bit, said high current creating a magnetic field of a predetermined orientation in said gate region representative of the data bit.

18. The method of claim 17 and further comprising:
applying a voltage to said gate region to enable said channel region to conduct.

19. The method of claim 17 wherein said high current is generated by creating a voltage between said first and second doped regions.

20. The method of claim 17 and further including reading the data bit stored in the gate region, comprising the steps of:
applying a voltage across said channel region to generate a current therethrough;
detecting the magnitude of the generated current; and
comparing the detected magnitude with predetermined magnitudes to determine the orientation of the magnetic field of the gate region.

21. A method of reading a stored bit having a logical value from a semiconductor device having
a substrate of a first conductivity type,
a gate region of ferromagnetic material defining a channel region in said substrate, said gate region having a magnetic orientation corresponding to the logical value of the stored data bit, and
first and second doped regions of a second conductivity type separated by said channel region, comprising the steps of:
generating a predetermined voltage between said first and second doped region which cuases a movement of electrons in said channel region from said first doped region to said second doped region, the path of the electrons being deflected in a predetermined direction corresponding to said magnetic orientation of said gate; and
detecting the difference in magnitude of current passing through said channel region caused by the deflection of said electrons in order to detect the direction in which the electrons are deflected and therefore the logical value of the stored bit.

22. The method of claim 21 wherein a magnetic orientation corresponding to the first logical value deflects said electrons toward the surface of the substrate below said gate region and a magnetic orientation corresponding to a second logical value deflects said electrons towards the bottom of the channel region.

23. The method of claim 22 and further comprising the step of further impeding the mobility of electrons at the surface of said substrate.

24. The method of claim 22 wherein said step of detecting the direction of deflection comprises measuring the level of current created in response to said predetermined voltage between said first and second doped regions.

25. A method of reading and writing data bits from a memory cell having a ferromagnetic gate defining a channel region between doped regions in a semiconductor substrate, comprising the steps of:
generating a high current through the channel region in a direction corresponding to a logical value of the data bit, said high current creating a magnetic field having an orientation corresponding to the logical value of the data bit in order to write a data bit;
applying a predetermined voltage across said channel region causing a current therethrough; and
detecting the magnitude of the current passing through said channel in order to determine the logical value of the stored bit in order to read a data bit.

* * * * *